(12) United States Patent
Garvan, III et al.

(10) Patent No.: US 8,637,401 B1
(45) Date of Patent: Jan. 28, 2014

(54) METHODS AND DEVICES FOR HIGH ACCURACY DEPOSITION ON A CONTINUOUSLY MOVING SUBSTRATE

(76) Inventors: Anthony Nicholas Brady Garvan, III, New York, NY (US); Christoph Erben, San Jose, CA (US); Darren Lochun, Mountain View, CA (US)

( * ) Notice: Subject to any disclaimer, the term of this patent is extended or adjusted under 35 U.S.C. 154(b) by 344 days.

(21) Appl. No.: 12/749,475

(22) Filed: Mar. 29, 2010

Related U.S. Application Data

(60) Provisional application No. 61/164,419, filed on Mar. 28, 2009.

(51) Int. Cl.
*H01L 21/44* (2006.01)
(52) U.S. Cl.
USPC ........... 438/675; 438/666; 438/667; 438/668; 438/674

(58) Field of Classification Search
USPC .......................... 438/675, 666, 667, 668, 674
See application file for complete search history.

(56) References Cited

U.S. PATENT DOCUMENTS 5,707,575 A * 1/1998 Litt et al. ...................... 264/104

* cited by examiner

*Primary Examiner* — Stephen W Smoot
*Assistant Examiner* — Vicki B Booker
(74) *Attorney, Agent, or Firm* — Joshua D. Isenberg; JDI Patent

(57) ABSTRACT

A method is explained that allows for a via to be filled with a dispensed material while the substrate is in continuous movement. A device is described that allows for a via to be filled while the target substrate is in continuous movement. The device consists of a material jetting system, a machine vision system that can detect the optimum trigger point, an electronic control circuit, a feedback mechanism and a web handling provision.

6 Claims, 10 Drawing Sheets

METHODS AND DEVICES FOR HIGH ACCURACY DEPOSITION ON A CONTINUOUSLY MOVING SUBSTRATE

CROSS-REFERENCE TO RELATED APPLICATION

This application claims priority to U.S. Provisional Application Ser. No. 61/164,419 filed Mar. 28, 2009 and fully incorporated herein for all purposes.

FIELD OF THE INVENTION

This invention relates to high-speed, high accuracy material deposition and more specifically to microvia filling on a continuously moving substrate.

BACKGROUND OF THE INVENTION

Via formation and via filling is used in traditional semiconductor manufacturing. These vias are formed in material such as silicon wafers, silicon substrates, or in PCB boards. These discrete substrates used in the electronics and semiconductor industry are rigid and thus, almost none of the methods developed for via formation or via filling in these industries are adapted for use on a continuously moving, roll-to-roll flexible substrate. Instead, these traditional methods are based on step-and-repeat techniques where the discrete workpieces are transported to a work zone, indexed to the proper location so that the via formation or clearing devices can operate, and then moved on while another work piece is then brought into position in the work zone.

Such a traditional step-and-repeat methodology, though suitable for discrete substrates, would significantly hamper a continuously moving, roll-to-roll manufacturing system. A careful review shows that a majority of the time and in some situations up to 90% of the time associated with these step-and-repeat systems is spent on transporting the substrates to the appropriate location, indexing them to the proper position for processing, and then moving them out while another substrate is moved into position. Thus, in terms of actual material deposition time, some traditional systems only utilize 1/10 of the deposition capacity as much of the processing time is devote to substrate transport and indexing. The material in such traditional systems cannot occur until these other steps are completed.

A typical material deposition system employs one or several deposition heads that are moved through the process area using XY linear stages. They are sufficiently precise, but have low throughput for continuous large area or high throughput processing. They are built with batch processing in mind, where the high density of vias per unit area is so high that indexing and alignment times are small relative to processing time. For a state of the art system using the batch-processing paradigm described above, approximately 90% of the cycle time will be consumed by alignment, indexing of the web, and indexing of the deposition.

A central challenge in cost-effectively depositing material into designated locations such as for via filling involves being highly accurate, tightly toleranced while not slowing and/or stopping the elongate substrate during processing. A system similar to a mark-on-the-fly (MOTF) architecture, in which the material is continuously moving under the deposition head or nozzle system may present some improvements. Despite the potential advantages of mark on the fly for application in roll-to-roll systems, its use was discouraged by experts in the field. In part, the reason for this is that traditional mark-on-the-fly architectures cannot mark or deposit at high precision relative to fast-moving, variable incoming material. The known MOTF systems would not be sufficiently capable and would most likely create numerous issues of inaccurate depositions.

Traditional mark-on-the-fly systems may operate in several modes, but the failures or drawbacks of the two most common will be described herein. In one mark on the fly architecture, an encoder is used to track the velocity of the web/part, and an external trigger is used to initiate the marking sequence. This technique is suitable for marking barcodes or part numbers on products, but it is completely unsuitable for our application, since it has no ability to precisely locate the mark relative to a predefined location on the web. In a different architecture, a camera is used to photograph the position of a fiducial, and an encoder is used to measure velocity. This technique represents a step up in precision relative to the first model, but traditional alignment and control algorithms, as well as numerous other details, make traditional implementations of this design slow and inaccurate.

Thus, there is a need for an improved high speed, high accuracy material deposition system.

SUMMARY OF THE INVENTION

The disadvantages associated with the prior art are overcome by embodiments of the present invention. Embodiments of the invention were conceived in response to a failure of traditional deposition head and systems to meet the demands of the application at acceptable quality and speed. Thorough investigations into the limits of state-of-the-art machine vision, galvanometer accuracies, and brainstorming lead to embodiments of high throughput, high precision deposition for roll-to-roll production systems.

For the contemplated roll-to-roll systems, large areas are desired to be processed at high speeds, with low via densities. A solution deposition system with deposition analogous to a mark-on-the-fly (MOTF) architecture, in which the material is continuously moving under the deposition head or nozzle system, would enable the deposition system to be used nearly 100% of the time. This has substantial advantages for the system design. First, to achieve a given throughput, fewer deposition heads. This has an immediate impact on capital expenditure for the deposition head or nozzle system. Second, using a modified MOTF architecture means spending more time filling at a given throughput, since the depositions heads or nozzles in a step-and-repeat process are only spending a small portion such as 1/10th the cycle time doing filling. Without the various improvements of the present invention to be discussed herein, those of skill in the art believe that MOTF systems are not possible with the accuracies contemplated herein.

The method uses a jet dispensing system for a material as it is available from known sources and others. These known systems do not currently handle a moving substrate but rather keep the substrate stationary and bring the jetting head into position. The method uses a machine vision set-up to detect the location of the via to be filled, its velocity and direction of travel. A control circuit determines the correct triggering time for the formation of the material droplet, which will be formed over a known period of time and released with a known velocity. The timing is such that the dispensed material will be placed inside the via without formation of voids or over spill.

In one embodiment of the present invention, the invention is for a new method for highly toleranced material deposition to predetermined pattern or position as part of solar cells using an architecture with vias or other openings. The method resolves the problem of filling vias located over large areas (>150 mm), at high speed (>6 m/min), at low via density (~1 via/cm^2) at moderate filling rates (>200 holes/s) with excellent performance per capEx and system reliability. Some systems may have even lower via density at 0.9 via/cm$^2$. Optionally, some systems may have even lower via density at 0.8 via/cm$^2$. Optionally, some systems may have even lower via density at 0.7 via/cm$^2$. Optionally, some systems may have even lower via density at 0.6 via/cm$^2$. Optionally, some systems may have even lower via density at 0.5 via/cm$^2$. Optionally, some systems may have even lower via density at 0.4 via/cm$^2$. Optionally, some systems may have even lower via density at 0.3 via/cm$^2$. Optionally, some systems may have even lower via density at 0.2 via/cm$^2$. Optionally, some systems may have even lower via density at 0.1 via/cm$^2$.

In some embodiments, it is desirable to perform a via fill with a jet dispensing method on a continuously moving substrate with web speed up to 20 m/min. Some of the overall through put is related to velocity of a dispensed drop, drop formation time, number of drops per second. In one embodiments, a deposition head may provide 5 m/s drop velocity, 3 ms drop formation, 200 drops per second. An accurate timing of a dispensed drop will allow a via fill at a web moving at high velocity. The present embodiment of the invention provides a set-up for accurate detection and triggering electronics.

A further understanding of the nature and advantages of the invention will become apparent by reference to the remaining portions of the specification and drawings.

DESCRIPTION OF THE SPECIFIC EMBODIMENTS

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a device optionally contains a feature for a barrier film, this means that the barrier film feature may or may not be present, and, thus, the description includes both structures wherein a device possesses the barrier film feature and structures wherein the barrier film feature is not present.

In one embodiment, the invention consists of a new control and machine architecture that enables the processing of high-quality vias at high accuracy relative to inconsistent incoming material. The increased precision can be divided into two areas of innovation: improved gauging, and improved timing. In one embodiment, the tolerances are +/−50 microns from the desired position. Optionally, the tolerances are +/−40 microns from the desired position. Optionally, the tolerances are +/−30 microns from the desired position. Optionally, the tolerances are +/−20 microns from the desired position. Optionally, the tolerances are +/−10 microns from the desired position.

Figure 1:
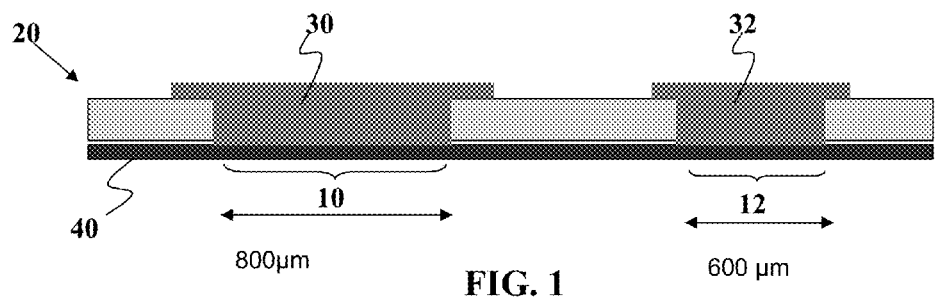
FIG. 1 shows a cross-sectional view of a substrate having a filled via according to one embodiment of the present invention.

Referring now to FIG. 1, a cross-sectional view of filled vias 10 and 12 in a substrate 20 are shown. FIG. 1 shows that the vias 10 and 12 in substrate 20 are filled with materials 30 and 32 respectively. In some embodiments, these are the same materials. An additional layer of material 40 may be used with some of the embodiments herein. In some embodiments, all of these materials are electrically insulating. For one embodiment of the present invention, the filled vias 10 and 12 are to be cleared in a manner so as to leave a sufficient amount of material 30 and 32 on the sidewalls and edges of the via so to isolate the substrate from material to be used in the cleared via.

Figure 2:
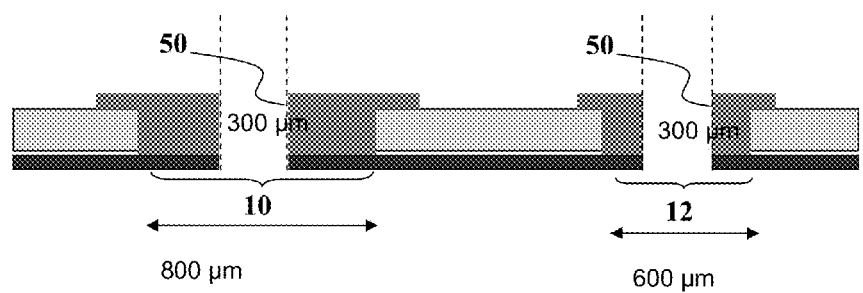
FIGS. 2 through 4 show various cross-sections of cleared vias according to embodiments of the present invention.

FIG. 2 shows a cross-sectional view of one embodiment of the present invention wherein the vias are cleared to have vertically aligned side walls 50. The vias are 300 microns in diameter in this embodiment. Other embodiments may use vias with different diameters and/or spacing. As can be seen in FIG. 2, there is sufficient coverage over the sidewalls and edges of the vias so as not leave any of those exposed.

Figure 3:
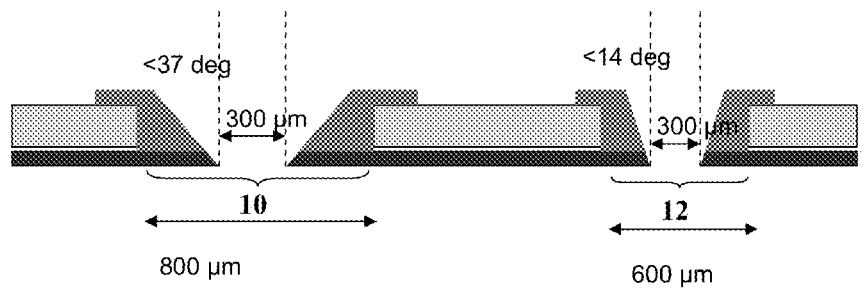

FIG. 3 shows yet another embodiment wherein the cleared portions of the vias are shaped and does not have vertically oriented side walls. This particular embodiment shows cone shaped vias, but it should be understood that other cross-sectional shapes such as curved, stepped, or other shapes may also be achieved. Many traditional systems which use mechanical or pneumatic systems to clear the vias do not have this level of control on the shape of the cleared portion of the via. FIG. 3 shows that in this embodiment, the cleared vias portions may have angled side walls from 14 to 37 degrees from vertical.

Figure 4:
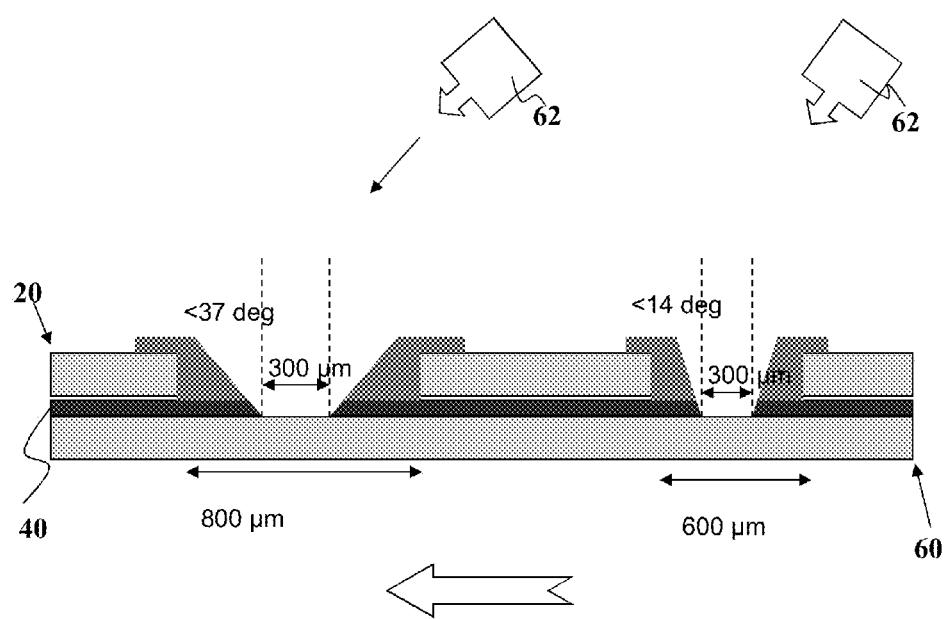

Referring now to FIG. 4, it should be understood that some embodiments may have one or more additional substrate layer(s) 60 that is below layer 40 and substrate 20. These maybe of the same or different composition than the substrate 20. Depending on how the layer 60 is configured, this may create a blind hole or a thorough hole for each via. Each configuration may be advantageous depending on how the via is to be used. In some embodiments, for example, a blind hole may allow for a layer of material to be left behind in the bottom of the via (due to reflection off of the layer 40). As will be discussed, the material deposition systems 62 herein may be configured to fill vias as shown in FIG. 2, 3, or 4.

FIG. 4 also shows that deposition heads may be angled so as to provide a larger processing window for delivering material into the via. FIG. 4 shows that in one embodiment, the substrate motion (indicated by arrow below the substrate) will indicate that the nozzle may be angled to provide the fluid with side ways velocity in the direction of the motion of the substrate. Optionally, other embodiments may have the nozzle normal to the plane of the substrate or have it in the opposite of the direction as shown in FIG. 4.

Figure 5:
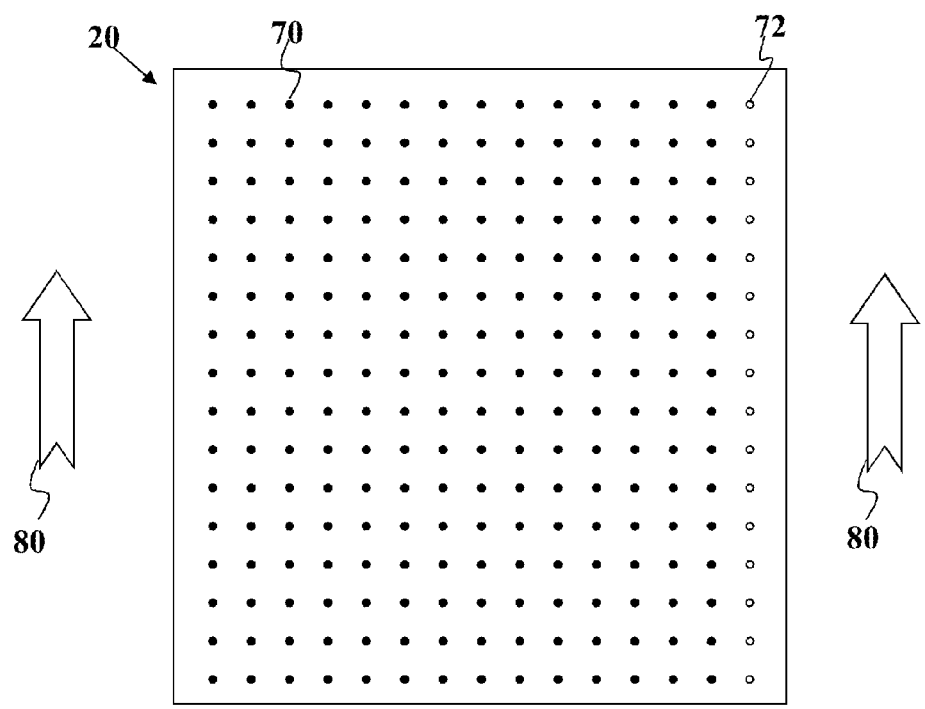
FIG. 5 shows a top down plan view of a moving substrate with a plurality of vias according to one embodiment of the present invention.

Referring now to FIG. 5, it should be understood that one embodiment of the present invention comprises of a substrate 20 that includes a plurality of partially cleared vias 70 and/or unfilled vias 72. The vias 72 can be used as fiducials for triggering the start of individual execution threads. Optionally, some embodiments can be configured to use the partially filled vias to be the fiducials for start of individual execution threads. The vias may be in rows, repeating patterns, and/or other configurations on the substrate. FIG. 5 only shows a portion of the larger elongate substrate that may be transported in a roll-to-roll manner. The arrows 80 show the direction of travel of the substrate 20. In some embodiments, the unfilled vias may be used for triggering the start of processes or for positioning purposes. Optionally, other marks, openings, colored portions, and/or triggers may be on the substrate to be used as initiators for the system.

System Configuration

Figure 6:
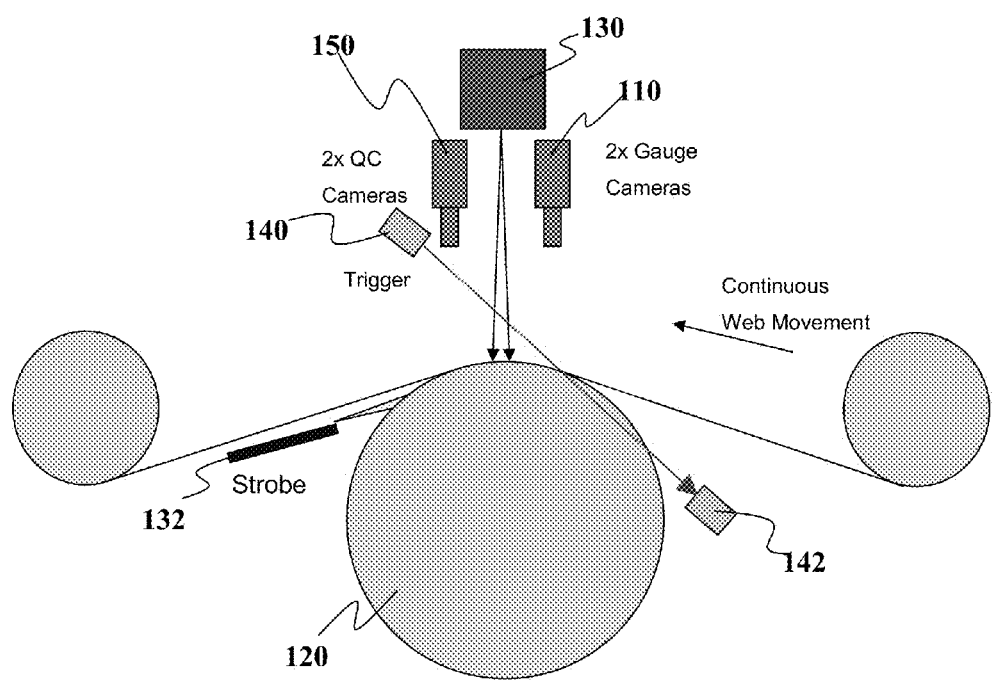
FIG. 6 shows a side view of a system according to one embodiment of the present invention.

Referring now to FIG. 6, one embodiment of the present invention will now be described. It should be understood that various embodiments of systems for filling or partially filling vias may include one or more of the following features. Some include more than two of these features. Some include all of these features.

1) Principle of Interceptive Alignment:

FIG. 6 shows that this embodiment has one or more detectors 110 located before the work zone. Although these are cameras in the present embodiments, other vision, mechanical, thermal, light based, and/or other detection systems may also be used in single or multiple combination with or in place of the cameras and not limited to any one type of camera or vision system. Some embodiments may have the cameras viewing straight down directly over the target spot on the substrate. Rather than relying on a single image to gauge the location of the via, a state-of-the-art vision system is employed to take a plurality of images of the via prior to the start of marking. This has two advantages. First, the velocity of the via or position to be filled can be obtained by performing a linear fit of the via position as a function of time. By avoiding the use of an encoder, this design makes the entire system internally defined and consistent. Second, the linear fit obtained by using multiple images exceeds the accuracy obtained by any one image, and statistical methods can then be employed to eliminate erroneous measurements. The detectors 110 in the present embodiment are located along two edges of the substrate and visualize vias at the ends of one row, crossweb. It should be understood that some systems may use a single camera, optionally, others may use more than two cameras. Some embodiments may use cameras in combination with other detectors to visualize the same or different via on the web. As will be discussed below, the triggering of the detectors 100 may be activated using a separate system so that there will not be drift of the via in the field of view of the camera over time. Without such a system, the position of the via position may be different when the detector 110 is activated.

For interceptive alignment, most laser controllers have a feature called mark on the fly which can be adapted for use with deposition systems herein. With a simulated encoder count, it automatically indexes the marking pattern, as if the part were moving underneath it. That automatically corrects for material shifting underneath it.

To benefit from MOTF deposition but at much higher accuracy, the present embodiment can have two ways to compensate for velocity of the moving substrate. For example, one may adjust initial position of via or use MOTF.

The present embodiment collects data prior to the mark, at the zero location the deposition device (nozzle, spray, or any other liquid deposition device) is triggered. From t (time) greater than zero, the Y position is determined by MOTF, which is also set in the system by software and/or hardware. Doing it this way allows one to use MOTF rather than just setting the position of the via. The second thing is that MOTF takes care of small changes in the sequence of the filling. For filling multiple vias at the same time, a plurality of deposition devices may be trigger to fill all of the vias in the row. The time that the system starts the fourth or any other deposition device (other than the first), the via is less well known and prone to jitter introduced by various system components upstream of trigger the deposition for say that fourth via's deposition device. By doing MOTF, one can make the temporal jitter not transfer into the tolerance because you can use MOTF. MOTF provides a feature of a deposition controller to automatically increment on a very short time scale to implement any deposition pattern to match a target on a moving substrate at a certain speed.

Most traditional MOTF are fed with an external encoder, but the present embodiment uses a simulated software encoder so that a single reference frame is used for the whole system and that reference frame and the MOTF can be used to achieve the accuracy. Use of multiple reference frames (two or more) is not excluded, but a single reference frame is the one used for the present embodiment. The reference frame is the marking field of the deposition device.

It should be understood that one embodiment uses a single coordinate system which is that of the deposition device. All interceptive calculations are done in that coordinate frame. Traditional system would have an external encoder, but that introduces many degrees of freedom. The present embodiment of the system prefers but is not limited to a single reference frame. This single reference frame is implemented from the calibration.

In one nonlimiting example, the camera may be right over the deposition target or otherwise co-axially aligned to be looking down over the target spot for deposition. In one embodiment, the system may use a calibration system having a test sample placed underneath deposition device and marking where deposition occurs. Then, the system may move cameras in place. Camera measures where the deposition spot is marked. In some embodiments, the amount of material deposited is reduced to minimize spatter and more easily locate the center of the deposition point. The coordinate system of the camera is mapped to the coordinate system of the deposition device. Thus, with a single coordinate system, the camera will generate raw data, which using calibration, is translated into the single reference frame of the deposition device.

2) Specialized Rollers:

The most accurate positioning of the foil occurs as the foil is tensioned over a shaped surface, which may include but is not limited to roller 120. Of course, other embodiments may use devices such as shaped vacuum beds or other shaped surfaces to control the foil. Although they may be used in some alternative embodiments of the present invention, traditional solid rollers are less preferable for this application for two reasons. The accurate and reliable way to locate the via is through back-lighting. Yet, if the via is back by a roll, one cannot gauge the position near the start of marking. The only option would be to gauge the via with non-backlighting, which may make the vision algorithm less robust, or to gauge the via location many inches away from the process zone, which makes the measurements more susceptible to drifts in velocity, edge-guiding, etc. Another compromise would be to process the vias over free-span web. Yet, this immediately makes the process susceptible to small changes in tension, internal stresses in the web, etc.

The high accuracy of this design desires a no-compromise solution to this problem. The present embodiment may be viewed as hybrid solution. Traditional stationary substrate deposition systems, as previous mentioned, have a throughput issue (more like a throughput per deposition head or nozzle watt issue). In a step-and-repeat process, by necessity, by the time one steps the material into the tool and align it, index the deposition heads or nozzles to the various locations one needs to get to, one basically only has the deposition head or nozzle on for about 12% of the time in a step-and-repeat. A mark-on-the-fly system has greater speed, but it is not sufficiently accurate. They are too coarse. They cannot align well with off the shelf systems. They are not used to align a deposition head or nozzle to a predetermined position.

The present embodiment has an extremely fast feedback on the location of the incoming hole. Thus, as a hybrid, it can combine the ability to have much higher deposition head or nozzle utilization, higher material output, while maintaining accuracy. One can use 10 times less deposition head or nozzle power since the system is at 95% deposition head or nozzle usage. The embodiments of the present invention can also spend more time at each via. Since the system can spend more time at each via, the system can provide better quality. The deposition head or nozzle marches on with the material as it goes by. This allows the deposition head or nozzle to position its beam wherever it needs to. The deposition head or nozzle can march with the via.

Figure 7A:
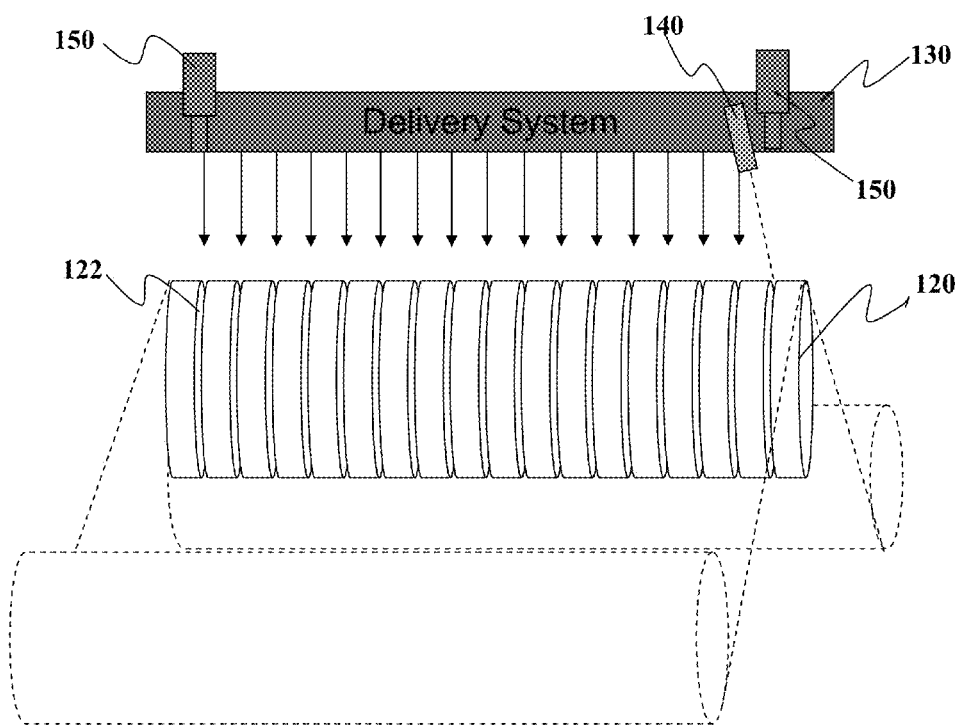
FIG. 7A shows a perspective view of a system according to one embodiment of the present invention.
Figure 7B:
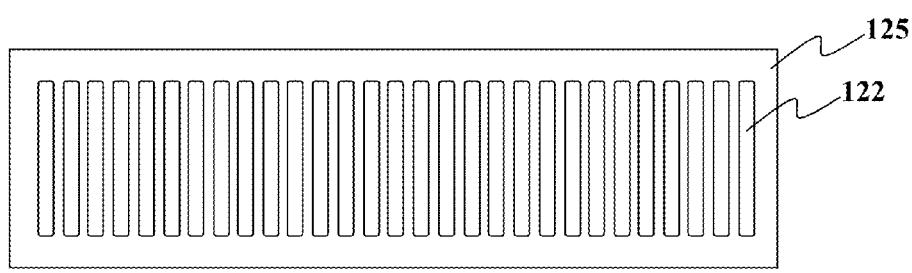
FIGS. 7B and 7C shows various views of a shaped substrate support according to embodiments of the present invention.

As seen in FIG. 7A, this embodiment of the system is designed with a specialty, grooved roller 120 with ~1.5" groves spaced at the pitch of the vias. Some embodiments may use a shaped plate 125 with grooves as seen in FIG. 7B (top down plan view) and FIG. 7C (side view). This designs allows the deposition head or nozzle 130 (which may include rows or arrays of nozzles) to deposit material through the via, and lets the via be back-lit in close proximity to the process zone, while at the same time maintaining the high tolerances associates with roller-backed processing. The process can occur over a roller and the system can use very little tension to keep things tolerenced very well. This is desirable in some situation where the substrate is less tolerant of stress in the system. Some may be prone to warp-age or the substrate may be multiple layers that can delaminate if excessively tensioned, curved, or otherwise treated. Of course, some embodiments may not use a groove 122 for each via location. Some may have a single groove for multiple columns of vias. Some may have grooves, openings or holes, aligned to rows, columns, and/or individual or groups of vias. Others may use other types or shapes of cutouts in the roller to allow for back lighting. Some may use dimples, holes, alternating cutouts or the like so that there is sufficient gap beneath the via to allow for a through-hole to be filled without reflection issues. It should also be understood that some embodiments may have grooves or cutouts sized to cover more than one via or opening at one time. The spacing and pitch may vary so long as, in the present embodiments, there is sufficient space on the underside to allow a through hole to be filled. A strobe (LED or otherwise) or other light source 132 may be used to backlight the vias for detection by the various sensors. An LED strobe can be used to strobe at so the system can acquire up to 250 Hz frame rates. Optionally, some other embodiments may be use front lighting alone or in combination with backlighting so long as the vias are sufficiently illuminated/discernible for tracking purposes.

Figure 7C:
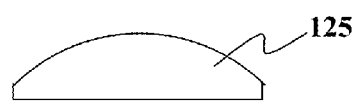

As seen in FIG. 7A-7C, the grooves 122 may be latitudinal grooves. Optionally, the grooves may be longitudinal grooves which extend crossweb instead of downweb. This crossweb grooved roller may be useful if the pitch between vias does not change much between rows of vias.

3) Hardware-Timed Queue:

Since the accuracy of the interceptive alignment algorithm depends in part on both gauging and timing accuracy, it is desirable to coordinate several functions across different equipment to high precision. The basic functions of the system are gauging (which includes measuring the via location at regular intervals), preparation for deposition (which includes calculation and communication to and from peripherals), and processing (which includes deposition and any related nozzle motion). To provide optimum accuracy, each via must be independently gauged and marked. Yet, the deposition head or nozzle must be in operation nearly 100% of the time.

To ensure a hardware time-offset between gauging and marking, it would be sufficient to have the two processes running on a single clock. Yet, this sequence will not be phase-locked to the location of the via. Thus, over time the via will appear at a random location in the field of view of the camera and the process zone of the deposition head. This would introduce numerous errors.

To ensure phase-locking, one embodiment may be sufficient to trigger the deposition head or nozzle/gauging sequence on each via. Yet, this introduces unacceptable timing errors, since then the delay between the marking and gauging sequences is determined by the spacing of the vias, and not internally defined.

In one embodiment, the solution is to combine the best aspects of both approaches by introducing the idea of execution threads. Digital signals to trigger the camera shutter, stroboscope, initiate communication, and trigger the deposition head or nozzle marker are all incorporated into a single hardware buffer, and together form one "thread." A phototrigger which detects every via row triggers a signal that distributes the trigger signal to initial the execution of a thread. Multiple execution threads then ensure continuous, phase-locked, hardware timed operation. Since one aligns to every line of the via (vs. every lane), this embodiment of the system become insensitive to variations in pitch or predetermined pattern downweb. In one embodiment, the number of execution threads may be tied to the number of separate processes that require specific blocks of time (see FIG. 10).

As seen in FIGS. 6 and 7A, a light source 140 may be used in one embodiment of this phototrigger to illuminate a row of unfilled vias. This is specific for the present embodiment. Optionally, others may use light source 140 to backlight vias filled with transparent or translucent material. In the current embodiment as seen in FIG. 6, the light source 140 will illuminate the unfilled via which will be detected by a sensor 142. This system is optional but particularly efficient at keeping the system in sync and minimizing drift of the via in the field of view of the camera or detector.

Optionally, the triggering of the execution threads may be activated by the partially filled vias. In such an embodiment, the unfilled column of vias is not necessary. The vias may also be illuminated or otherwise visually designated or illuminated so that the execution threads will begin substantially at the same position in the field of view of the detector. This is to minimize drift where the execution thread begins, but the via position in the field of view of the camera is not consistent between each row. Optionally, other embodiments may use cuts or slits along the edges of the web or other markers such as printed areas or the like to help assist in the phase locking of triggering of each execution thread. Optionally, some embodiments do not trigger on every unfilled row of vias, but only every other row or some other partial sequence wherein the start of the other rows is internally timed.

A buffered input in the controller is desired to update via locations at same time as its filling the first set of vias. The system, in one embodiment, update position and other information on the next set of vias while filling the current set of vias.

4) Internal Calibration, Closed-Loop Operation:

Due to the high absolute accuracy desired from the system, two areas of innovation were desired to ensure both excellent initial accuracy, and to eliminate long-term errors due to temperature, wear, etc. To achieve this, a configuration of cameras is employed both before the process zone (for gauging) and after the process zone (for closed-loop operation and initial calibration procedure).

A procedure, which includes both methods and algorithms, has been developed to identify calibration coefficients that directly relate the location of the via from the gauging system (measure in pixels) to the signal voltage input to the XY servo motors. This procedure eliminates the need for high precision machining or precise mechanical alignment. Rather, the accuracy of the system is completely determined by the accuracy of the gauging apparatus and the short-term repeatability of the deposition head or nozzle marker.

As seen in FIGS. 6 and 7, the detectors 150 located after the process zone participate both in the initial calibration of the deposition head or nozzle system and continuously monitor the position of the hole relative to the predetermined hole. This data is statistically accumulated and used to trim calibration coefficients to correct for long-term drift.

In one embodiment, the timing of the tasks in each execution thread based on that internal clock or reference frame for that execution thread. This is opposite of most known techniques but in the current implementation, is highly accurate once the execution thread is started.

Figure 8:
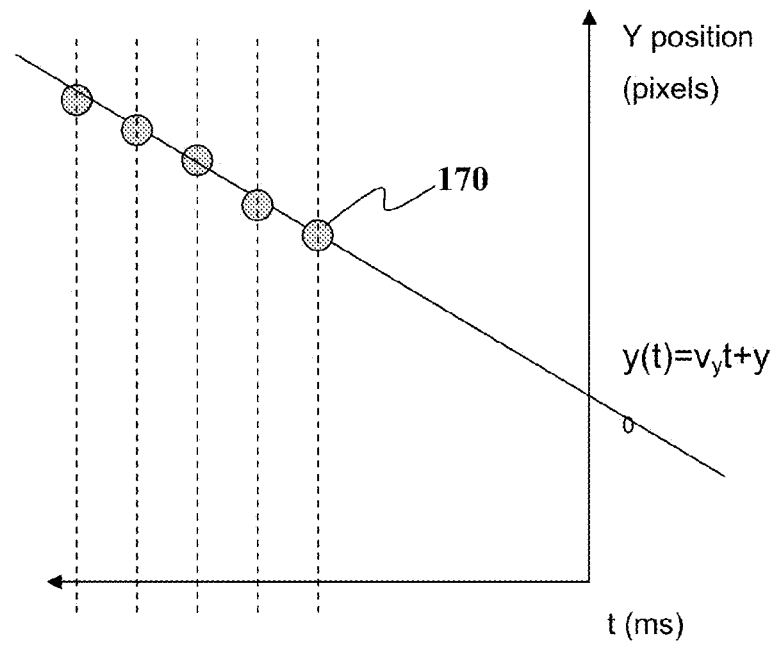
FIGS. 8 and 9 are time and position plots of vias in Y and X axis according to embodiments of the present invention.
Figure 9:
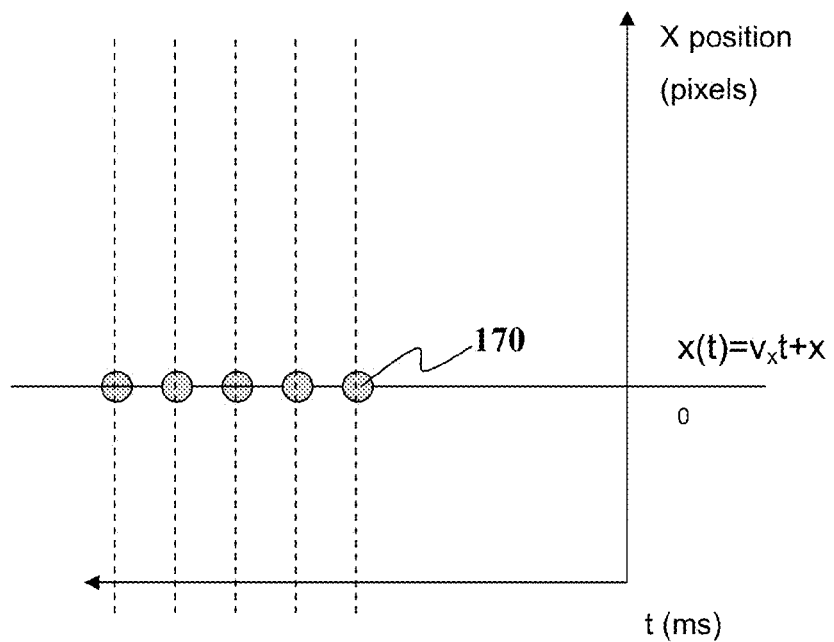

As seen in FIG. 8, one embodiment of the system has several cameras visualizing several vias before the vias hit the processing zone. Those cameras load positions of the vias into the deposition head or nozzle system. The deposition head or nozzle is triggered at a known interval at the time of gauging (optionally it maybe triggered based on another issue). The deposition head or nozzle intercepts the via at a time and place that has been measured (at each line). FIG. 8 shows a Y position for the approaching via over time. FIG. 9 shows an X position for that same approaching via over time.

The present embodiment uses the sequence of vias locations in each image over time to calculate: 1) offset in x and y 2) speed of via 3) theta alignment or misalignment (of punch tool) 4) with two cameras going at the extreme ends of the web, one can also gauge the stretch of the vias.

The stretch of the vias is not a lot, but the use of the detectors 150 after the work zone will allow us to correct for a gain error in the deposition head or nozzle system. Deposition heads or nozzles have a repeatability (4" field of view, repeatability may be from 2 microns to 8 microns). Repeatability is very high, but day to day variations may be from 25 to 50 microns or more. One can fire at some spot, but that spot may drift.

By measuring before and after every via by the detectors before and after the deposition head or nozzle, by having a closed loop measuring before and after every via one can correct for that. One can reduce the process control window. At about 100 hz, 6 m per minute speed, the present embodiment can get 8 to 10 pictures of the via before it hits the process zone.

One will have the position of X and Y as a function of time for both vias at the edge. Between the two cameras and other info X, Y, velocity, theta, and/or pitch, the system should be able to provide sufficient information to target the deposition head or nozzle to fill desired area of the via.

Uncertainty in time is both internal uncertainty in time between images, and more difficult, the time to the start of the mark (happening on different equipment in the system). To keep these tolerances, the present embodiment may have three different execution threads triggered by the via. Constantly measuring and firing will not work since the via will drift in the field of view of the camera and the deposition head or nozzle. If one just triggers on every via, the gauging is based on via spacing and not some internal clock. One may want all the times to be fixed (all internally timed). The problem is that there is time needs for each step.

Figure 10:
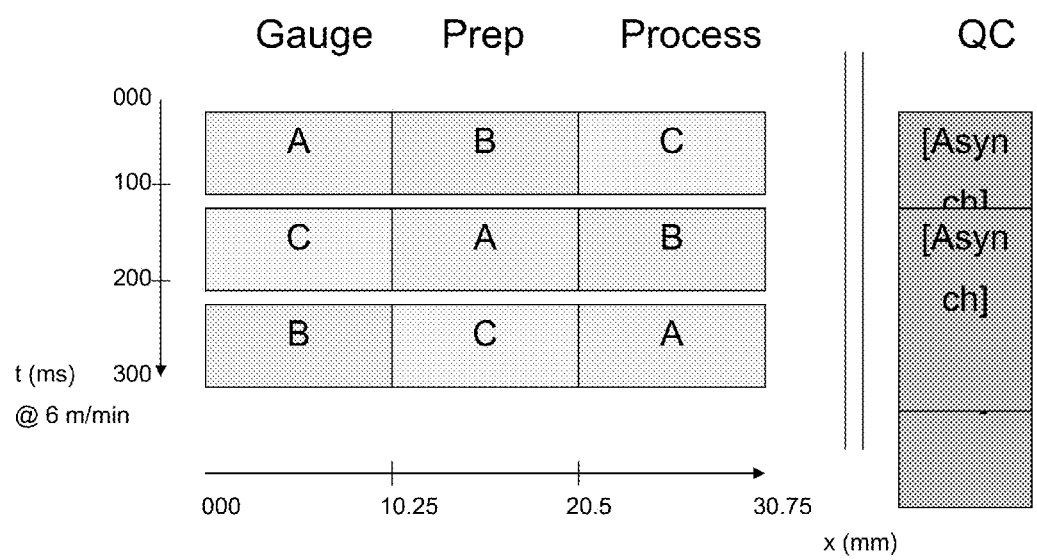
FIG. 10 shows a schematic of execution threads according to embodiments of the present invention.

Referring now to FIG. 10, by way of nonlimiting example, one system may use 100 ms to gauge, 100 ms to mark, 100 ms to process. FIG. 10 shows a system with multiple execution threads. Each may be triggered by fiducials from the empty via. The trigger will start the execution threads which is individual in the present embodiment for each row or set of vias. Of course, some embodiments define a set of vias differently (in columns or other patterns). Using an execution thread for more than one row is not excluded. Some may use the same execution thread for two rows or sets of vias in a row. Some may use the same execution thread for three rows or sets of vias in a row. Some may use the same execution thread for four rows or sets of vias in a row. Some may use the same execution thread for multiple rows or sets of vias in a row. Optionally, some may use the time zero mark to time the triggering of deposition devices. It should be understood that system where the position of the vias does not change in one axis (such a X axis) but may have variations in another (such as Y axis due to pitch variation) is handled very well by many of the embodiments of the present system.

In one embodiment, the trigger that starts is a course measure, but each execution thread use the cameras or other detector to highly accurate in time and position for the start of the "mark" at time zero. Thus in this particular example, a 300 ms method is used that should run continuously. But one wants to run continuously and not a third of the time. All these operations desire to be going on at the same time, but each via desires to be specially treated. Each via has an unfilled via that is punched but not filled. That via is used to trigger this sequence for every row. Once that is triggered, each via (or via row) has a clock start. Each via (or via row) has its own timing for marking and gauging. Each clock has its own row of vias. Three execution thread, one is measured, one is length is communicating, one unit length for processing.

Figure 11:
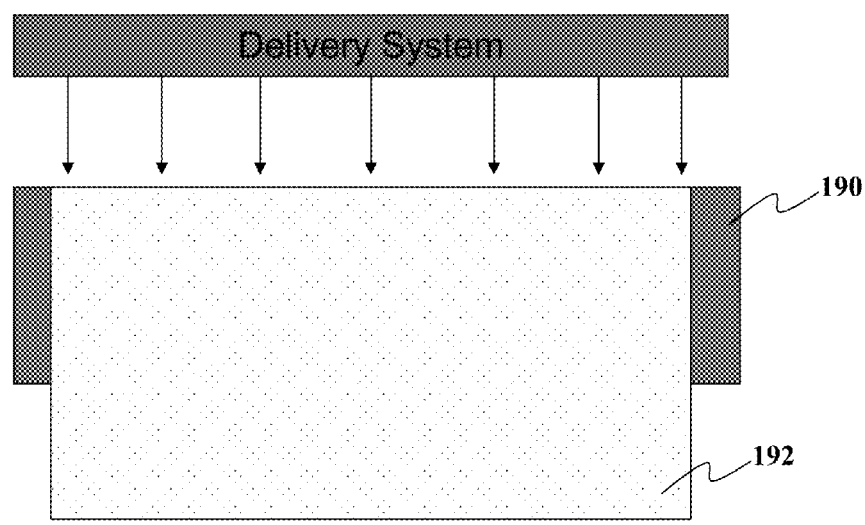
FIGS. 11 and 12 show various views of systems with different configuration according to embodiments of the present invention.

FIG. 11 shows that in one embodiment, the web or substrate 190 is not as wide as the roller 192. Optionally, other embodiment may have web as wide as or wider than the roller, so long as the vias are in the field of view of the deposition head or nozzle.

Figure 12:
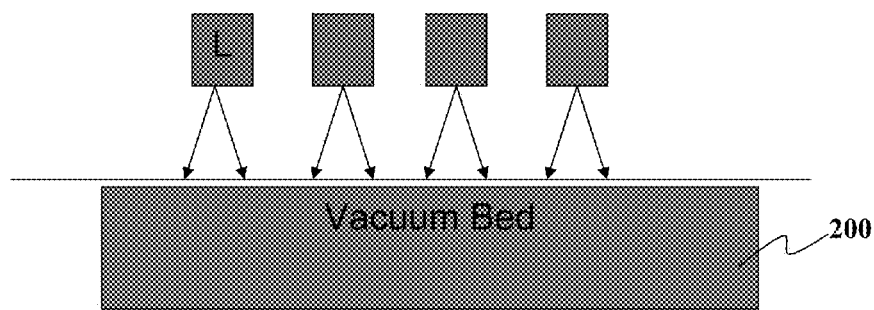

FIG. 12 shows that in some embodiments, instead of a roller, a vacuum bed 200 may be used to keep the web flat during deposition head or nozzle filling. Optionally, some embodiments may use a vacuum roller to hold the web flat in the deposition head or nozzle processing zone.

Figure 13:
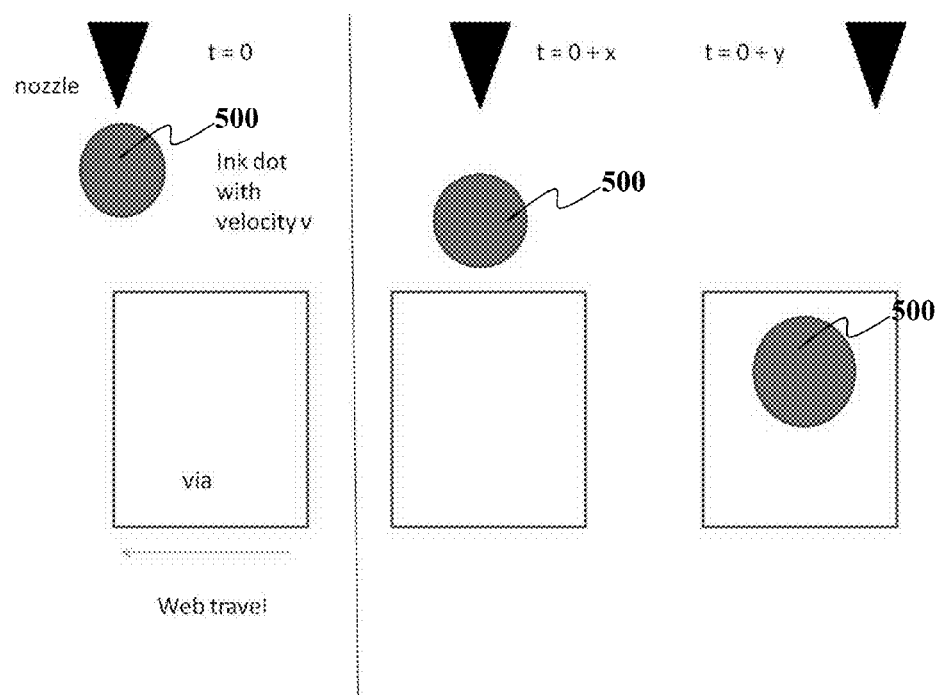
FIG. 13 show a side view of a droplet deposition according to embodiments of the present invention.

FIG. 13 shows that with a highly repeatable system wherein the time it takes for a droplet 500 to form and travel to the desired location is known, this allows for the system where the material can be accurately deposited if the via or registered/addressable position is known to be at a certain place at a certain time. This interceptive delivery of material when mated with the highly accurate via locating system allows for high throughput via filling or material deposition on a continuously moving substrate which by way of nonlimiting example may be at speeds of 5 m or more per minute. Although FIG. 13 is shown with the nozzle or deposition head pointed straight down, it should be understood that other embodiments may be designed to be angled so that the droplet is accelerated with or optionally against the direction of travel of the substrate or web.

By way of nonlimiting example, one embodiment can have the deposition system aligned to be 10° from vertical. Optionally, one embodiment can have the deposition system aligned to be 20° from vertical. Optionally, one embodiment can have the deposition system aligned to be 30° from vertical. Optionally, one embodiment can have the deposition system aligned to be 40° from vertical. Optionally, one embodiment can have the deposition system aligned to be 50° from vertical. Optionally, one embodiment can have the deposition system aligned to be 60° from vertical.

Some embodiments may further have the system in a distance close to the web or substrate to minimize time to the substrate. By way of nonlimiting example, one embodiment can have the deposition system positioned about 0.5 mm from the substrate surface. Optionally, one embodiment can have the deposition system positioned about 1 mm from the substrate surface. Optionally, one embodiment can have the deposition system positioned about 2 mm from the substrate surface. Optionally, one embodiment can have the deposition system positioned about 3 mm from the substrate surface. Optionally, one embodiment can have the deposition system positioned about 4 mm from the substrate surface. Optionally, the distance is selected to be no more than about 50% of the size of the droplet formed by the deposition tool. Optionally, the distance is selected to be no more than about 100% of the size of the droplet formed by the deposition tool. Optionally, the distance is selected to be no more than about 150% of the size of the droplet formed by the deposition tool. Optionally, the distance is selected to be no more than about 200% of the size of the droplet formed by the deposition tool. Optionally, the distance is selected to be no more than about 250% of the size of the droplet formed by the deposition tool. Optionally, the distance is selected to be no more than about 200% of the size of the droplet formed by the deposition tool.

Compared to non-deposition head or nozzle clearing, the present embodiment of the deposition head or nozzle based systems provides a variety of advantages including the following: 1) Enables high-reliability via structure for liquid primary insulation; 2) Enables the use of solid-film primary insulation, which impacts both cost and reliability; or 3) Superior reliability and performance over mechanical microvia punching.

Compared to Traditional Step-and-Repeat Methods, the present embodiment of the via clearing system provides a variety of advantages including the following: 1) Improved Thoughput/CapEx 2) Improved Reliability 3) Improved Via Quality 4) High accuracy. 5) Simplified debris-removal 6) No reliance on high-precision machining 7) Superior scalability Compared to Traditional MOTF Methods, the present embodiment of the via clearing system provides a variety of advantages including the following: 1) High accuracy marking relative to variable incoming material 2) Closed-loop operation.

In one nonlimiting embodiment of the present invention, a 1× deposition head or nozzle marker is configured for processing about a 160 mm×10 mm area continuously. Four high-speed cameras from a manufacturer such as Keyence, Inc. acquire images up to >150 Hz, allowing the via position to be gauged up to 10 times at 6 m/min line speed. Two cameras are used for gauging before the process zone, measuring the vias on the edge. Two cameras are used after the process zone for QC and initial alignment. A 25 mm lens and 2× teleconverter, with 10 mm spacer, permits optimal field of view and working distance. A high-power XeF stroboscope is used, and triggered by the hardware-timed execution thread. Using 2× camera systems for gauging will allow corrections for X,Y, Theta, velocity, and via pitch (spacing).

The deposition head or nozzle can simultaneously mark and communicate, thus new via positions can be loaded while the deposition head or nozzle is processing. These separate execution threads enable nearly continuous operation.

Control system uses 4×PXI-6221 DAQ devices from national instruments in a PXI chassis running a labview real-time operating system. The correlated DIO port of 1×PXI-6221 is used to distribute triggers from a compact deposition head or nozzle-through hole sensor (Keyence H100 series). The correlated DIO ports from the remaining 3×PXI-6221 are used to run 3× execution threads.

Advantages of this technique should accumulate at higher throughputs, rather than simultaneously improve absolute throughput, via quality, and throughput per deposition head or nozzle watt.

Optionally in other embodiments, multiple deposition heads or nozzles may be used which means each deposition head or nozzle is only responsible for marking a smaller area in the cross-web direction.

If very higher throughputs are desired (>12 m/min), image processing and transfer times may become significant. To increase sampling rates, a high-rep-rate stroboscope could be used to obtain multiple images of the via in a single frame. This would reduce digital overhead.

Due to space constraints, it is convenient to distribute the marking heads over several rollers. For sixteen marking heads, it is convenient to distribute them at 4× marking heads per roller.

It should be understood that Keyence deposition head or nozzle markers are non-essential. Keyence machine vision system is not essential. These parts are chosen for convenience, and because they represent the state of the art for these types of systems, and are convenient to use. The precision number of cameras used for gauging and feedback is not essential, and depends on the desired balance between system redundancy v complexity. Other components may be used which provide the same functionality.

It should also be understood that MOTF as used herein, automatically takes the Y position for a certain speed of the substrate. Uncertainly with when the deposition device was triggering is reduced with MOTF. In the present embodiment, the initial start of the mark is very precise; what is imprecise is the deposition device start. But with MOTF, if uncertainty is there as to deposition device start, it is substantially reduced as the system will track the via and will "push" the via down the web for the targeting system. With MOTF, one pins the error to time zero start of the mark. After that it is adjusted for in Y by MOTF.

It should be understood that the embodiments herein may a) use different execution threads, hardware coordination, and having it all in one coordinate frame and b) do the calibration and setting the entire system in the coordinate frame of the deposition device. One could implement the system with more than one coordinate frame and that is not excluded.

Single coordinate, mark on the fly that uses a simulated encoder is not shown or suggested by the known system. They known state of the art is not imagining using simulate encoder when position and speed are quickly identified; it is more precise in such a system to sue an internal simulated encoder.

Fiducials only provide a very course position. They trigger the process thread, the camera identifies each row of vias accurately. It intercepted by the cameras to accurately trigger the mark at time zero, which is triggered for all deposition devices in this embodiment with the same reference frame.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, it should be understood that they are not limited to filling empty or partially filled vias. They can be used for high accuracy deposition for other purposes and on other target materials. Some alternative embodiments may use a conveyor belt with gaps for backlighting the vias. Optionally, translucent rollers may be used. Although they generally do not work well for through holes, they maybe suitable for other types of filling or hole creation. At 10 microns, everything either absorbs or reflects. If one has a glass roller, the deposition head or nozzle will mark it up constantly. With a metal roller, reflection of deposition head or nozzle will mess up the hole and reflection will come up and fill in some other place. However, some embodiments may control such reflections. Optionally, a material dispense mechanism can also be employed on a stationary substrate with a moving dispense head.

Furthermore, those of skill in the art will recognize that any of the embodiments of the present invention can be applied to almost any type of solar cell material and/or architecture. For example, the absorber layer in solar cell 10 may be an absorber layer comprised of silicon, amorphous silicon, copper-indium-gallium-selenium (for CIGS solar cells), CdSe, CdTe, $Cu(In,Ga)(S,Se)_2$, $Cu(In,Ga,Al)(S,Se,Te)_2$, Cu—In, In—Ga, Cu—Ga, Cu—In—Ga, Cu—In—Ga—S, Cu—In—Ga—Se, other absorber materials, II-VI materials, IB—VI materials, CuZnTe, CuTe, ZnTe, IB-IIB-IVA-VIA, or other alloys and/or combinations of the above, where the active materials are present in any of several forms including but not limited to bulk materials, micro-particles, nano-particles, or quantum dots. The CIGS cells may be formed by vacuum or non-vacuum processes. The processes may be one stage, two stage, or multi-stage CIGS processing techniques. Additionally, other possible absorber layers may be based on amorphous silicon (doped or undoped), a nanostructured layer having an inorganic porous semiconductor template with pores filled by an organic semiconductor material (see e.g., US Patent Application Publication US 2005-0121068 A1, which is incorporated herein by reference), a polymer/blend cell architecture, organic dyes, and/or $C_{60}$ molecules, and/or other small molecules, micro-crystalline silicon cell architecture, randomly placed nanorods and/or tetrapods of inorganic materials dispersed in an organic matrix, quantum dot-based cells, or combinations of the above. Many of these types of cells can be fabricated on flexible substrates.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a size range of about 1 nm to about 200 nm should be interpreted to include not only the explicitly recited limits of about 1 nm and about 200 nm, but also to include individual sizes such as 2 nm, 3 nm, 4 nm, and sub-ranges such as 10 nm to 50 nm, 20 nm to 100 nm, etc. . . . .

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited. For example, U.S. patent application Ser. Nos. 11/207,157 filed Aug. 16, 2005 and 12/064,031 filed Aug. 16, 2006 are fully incorporated herein by reference for all purposes.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A deposition method comprising:
   continuously moving a substrate having a plurality of a set of vias;
   using an individual execution thread for each set of vias on the substrate such that at least a first set of vias is configured to be filled while a second set of vias is monitored for at least position and speed;
   using a detector system and a deposition system calibrated to both use identical reference frames;
   using a detector system which monitors positions of a via in the substrate over time to determine X and Y position over time; and
   processing the position to determine when to start the deposition system;
   using a separate triggering system to phase lock the start of each execution thread and minimize any drift of a via in the field of view of the detector system;
   wherein the substrate is continuously moving.

2. The method of claim 1 wherein via density on the substrate is 1 via/cm$^2$ or less.

3. A deposition method comprising:

continuously moving a substrate having a plurality of a set of vias;

using an individual execution thread for each set of vias on the substrate such that at least a first set of vias is configured to be filled while a second set of vias is monitored for at least position and speed;

using a detector system and a deposition system calibrated to both use identical reference frames; and using a shaped substrate support to tension and flatten the substrate.

4. The method of claim 3 comprising:

wherein the shaped substrate support comprises a roller having a plurality of grooves.

5. The method of claim 4 comprising:

wherein the grooves each correspond to a column of vias in the substrate.

6. A deposition method comprising:

continuously moving a substrate having a plurality of a set of vias;

using an individual execution thread for each set of vias on the substrate such that at least a first set of vias is configured to be filled while a second set of vias is monitored for at least position and speed;

using a detector system and a deposition system calibrated to both use identical reference frames; and using a shaped substrate support wherein the support is configured to provide backlighting of a filled via.

\* \* \* \* \*